United States Patent [19]

Cutts et al.

[11] Patent Number: 5,546,276

[45] Date of Patent: Aug. 13, 1996

[54] HOUSING FOR ELECTRICAL APPARATUS

[75] Inventors: Stanley J. Cutts, Winchester; Ian Golledge, Romsey, both of United Kingdom

[73] Assignee: International Business Machines Corporation, Armonk, N.Y.

[21] Appl. No.: 312,726

[22] Filed: Sep. 26, 1994

[30]     Foreign Application Priority Data

Sep. 24, 1994 [GB] United Kingdom ............... 9319752

[51] Int. Cl.$^6$ ................................................. H05K 5/00
[52] U.S. Cl. ................. 361/724; 361/685; 361/730; 361/796; 361/756; 361/802
[58] Field of Search ............................... 361/683, 684, 361/685, 686, 724, 725, 726, 727, 730, 742, 796, 797, 756, 802; 312/223.1, 223.2, 223.6, 321; 364/708.1

[56]              References Cited

U.S. PATENT DOCUMENTS

| | | | |
|---|---|---|---|
| 3,767,974 | 10/1973 | Donovan, Jr. et al. | 317/101 DH |
| 4,227,237 | 10/1980 | Matthews et al. | 361/415 |
| 4,247,882 | 1/1981 | Prager et al. | 361/380 |
| 4,301,494 | 11/1981 | Jordan | 361/415 |
| 4,754,397 | 6/1988 | Varaiya et al. | 364/200 |
| 5,034,853 | 7/1991 | Mazura et al. | 361/391 |
| 5,309,323 | 5/1994 | Gray et al. | 361/726 |
| 5,343,361 | 8/1994 | Rudy, Jr. et al. | 361/710 |

*Primary Examiner*—Leo P. Picard
*Assistant Examiner*—Lynn D. Hendrickson
*Attorney, Agent, or Firm*—Paik Saber

[57]               ABSTRACT

A housing designed to accommodate a plurality of removable electrical devices includes power connectors mounted within the housing for connecting a power source to each of the devices. In order to prevent a user from inadvertently contacting live connectors within the housing, the housing is provided with one or more safety elements e.g., in the form of fins fixed in the cavity which are positioned to lie between adjacent devices. The position, size and location of the pins are strategically chosen to prevent access to the connector(s). The position of the fins between the devices allows the user access to the devices to load and unload them into and from the housing.

10 Claims, 2 Drawing Sheets

HOUSING FOR ELECTRICAL APPARATUS

BACKGROUND OF THE INVENTION

1. Technical Field

The present invention relates generally to the field of housings for electrical apparatus and more specifically to a housing incorporating a safety structure for preventing an operator from accidentally contacting hazardous sources of electrical energy within the housing.

2. Description of the Background Art

A current trend in the design of electrical and electronic systems is to modular system configurations wherein individual electrical units of the system are readily accessible and in some cases customer removable. The use of modular designs provides a number of different advantages. Manufacture and assembly is made simpler in that each unit can be manufactured and tested separately before being assembled in the complete system. Furthermore, if a removable unit becomes defective, it can be readily removed for repair and replaced with a working device.

A typical multi-component system of this type is a data processing system in which data storage devices, processing hardware, power supplies and cooling fans are contained within a single housing. Typically, the removable data storage devices will be mounted within a first compartment of the housing which is separated by an internal bulkhead from a second compartment in which are located the processing hardware, power supplies etc. Provision of power and control signals to each of the devices is effected via connectors mounted in the bulkhead which mate with one or more connectors at the rear of each device.

In a system housing of the type described above including internal power connectors, it is necessary to prevent a system operator from accidentally coming into contact with hazardous electrical sources (e.g., exposed voltages) within the housing. Therefore, it is necessary to ensure that the high energy connector pins are not accessible to the operator's fingers. This requirement can be directly achieved either by providing the power connector with a shroud or recessing the pins in the connector, thereby rendering the pins inaccessible. Alternatively the problem can be avoided by designing the connector with female contacts. However in many situations it will not be practicable for reasons of space or economy to provide either connector shrouding or female power connectors. In these situations alternative solutions are needed.

One known solution is to provide a removable grill structure at the front of the housing and in front of the electrical units which protects the operator from accidental contact with the live connector(s) within the housing. Although this provides the necessary protection, it is necessary to remove the grill each time it is desired to gain access to the housing cavity to plug or unplug the devices. The additional cost involved in providing such a grill is a further disadvantage. Alternative techniques, e.g., the provision of a shutter arrangement at the front of the housing, suffer from the same disadvantages in that they do not allow the operator access to load or unload the devices while at the same time providing the necessary protection.

SUMMARY OF THE INVENTION

The present invention seeks to overcome the disadvantages of prior techniques and accordingly provides a housing for accommodating a plurality of electrical devices removably mountable in a cavity within the housing via an opening at one side of the housing. The housing includes a plurality of internally mounted power connectors for connecting each of the devices to a power source. The power connectors are positioned at a side of the housing cavity opposite the opening to mate with a corresponding connector on each device. The housing further includes finger access prevention means for preventing an operator from accessing exposed portions of the power connectors via the opening. The access prevention means comprises one or more elements mounted internally in the housing cavity and positioned between adjacent ones of the plurality of electrical devices so as not to impede removal of the devices. The configuration of the elements within the housing is chosen so as to prevent access of the operator's fingers to the power connectors.

Protection is afforded by appropriate choice of element configuration; i.e., by choice of number of the elements, size of the elements and position of the elements between the opening and the connectors. In this manner, the housing of the present invention solves the safety problem of protection from high energy exposure within the housing through impeding the access of the operator's hand by means of the access prevention elements but at the same time positioning the elements between devices so as to allow the operator access to load and unload the electrical devices from the housing.

In a housing configuration designed to accommodate two devices mountable side-by-side in the housing cavity, sufficient protection may be afforded by a single element located in the gap between the devices. In housings designed to accommodate more than two devices, it may be necessary to employ more than one element. It will be appreciated that the number, position and size of elements required to provide protection are dependent on the dimensions of the housing opening and also on the location within the housing of the exposed portions of the connector.

In a preferred housing, the access prevention elements take the form of fins extending from an inner surface defining the cavity into the cavity itself. The fins are placed at strategic intervals across a dimension (e.g., the width) of the housing so as to allow devices to be loaded and unloaded without hands being able to reach into the housing to contact exposed power terminals. It is further preferred that the housing further includes a plurality of guide rails attached inside the housing cavity and extending from a position at or near the opening to the power connectors, each of the plurality of devices being mountable via one side thereof onto at least one of the guide rails, wherein each of the fins is fixed to a guide rail and extends perpendicularly therefrom. As compared to prior techniques, the use of fins attached to guide rails provides for low cost assembly. Such an assembly also allows for retro-fitting of safety fins to housings in need of safety protection.

Although suitable for use in housing a variety of removable electrical devices, the housing according to the present invention is especially useful in housing removable data storage devices (e.g., disk drives, tape drives, etc.) in view of the now common requirement that data storage systems permit customer removal and replacement of devices.

A preferred embodiment of the invention will now be described by way of example only with reference to the accompanying drawings.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

Figure 1:
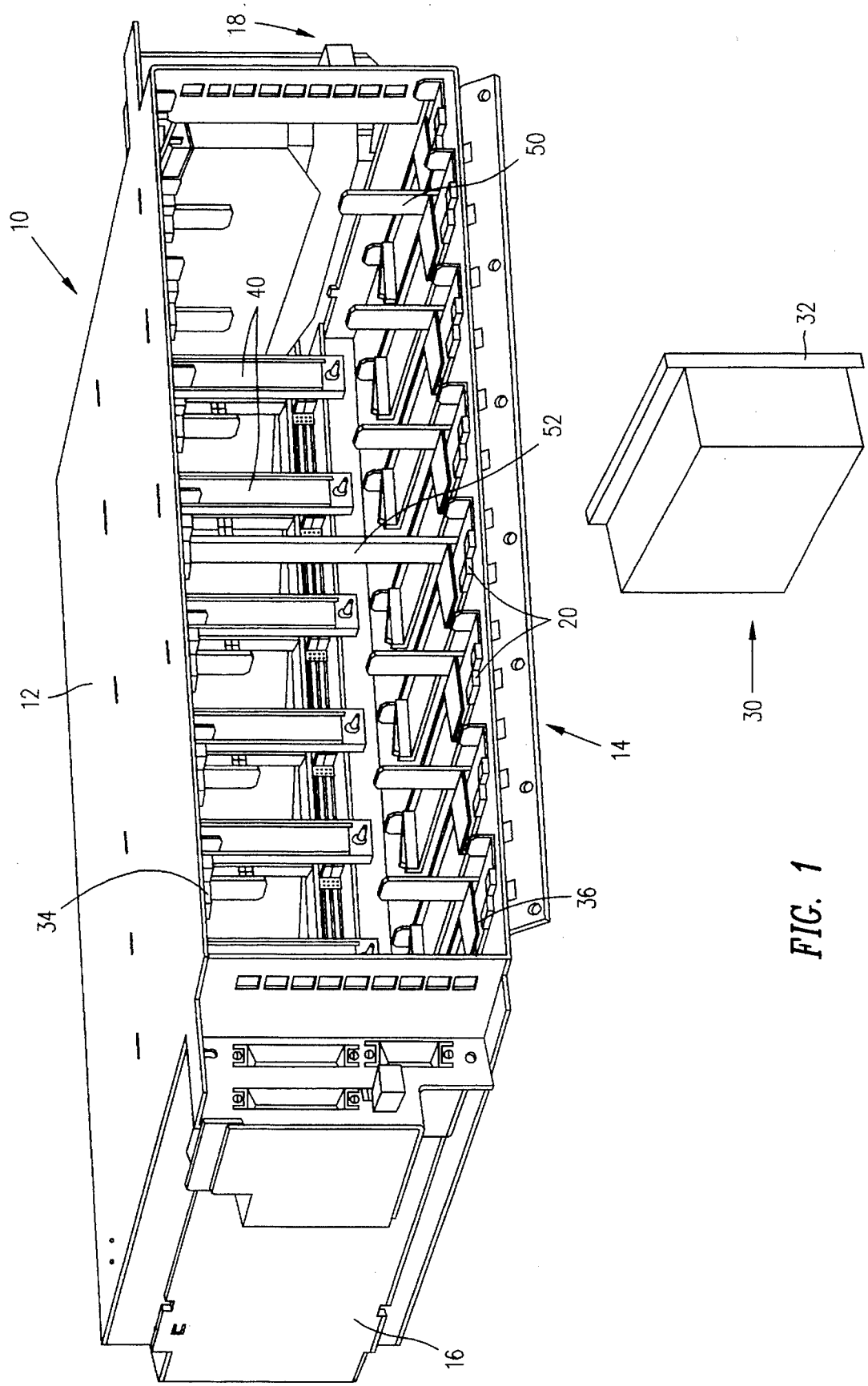
FIG. 1 is a side perspective view of a housing including a plurality of safety fins for preventing access to power connectors at the rear of the housing and a perspective view of an electrical device which is shown separately from the housing.
Figure 2:
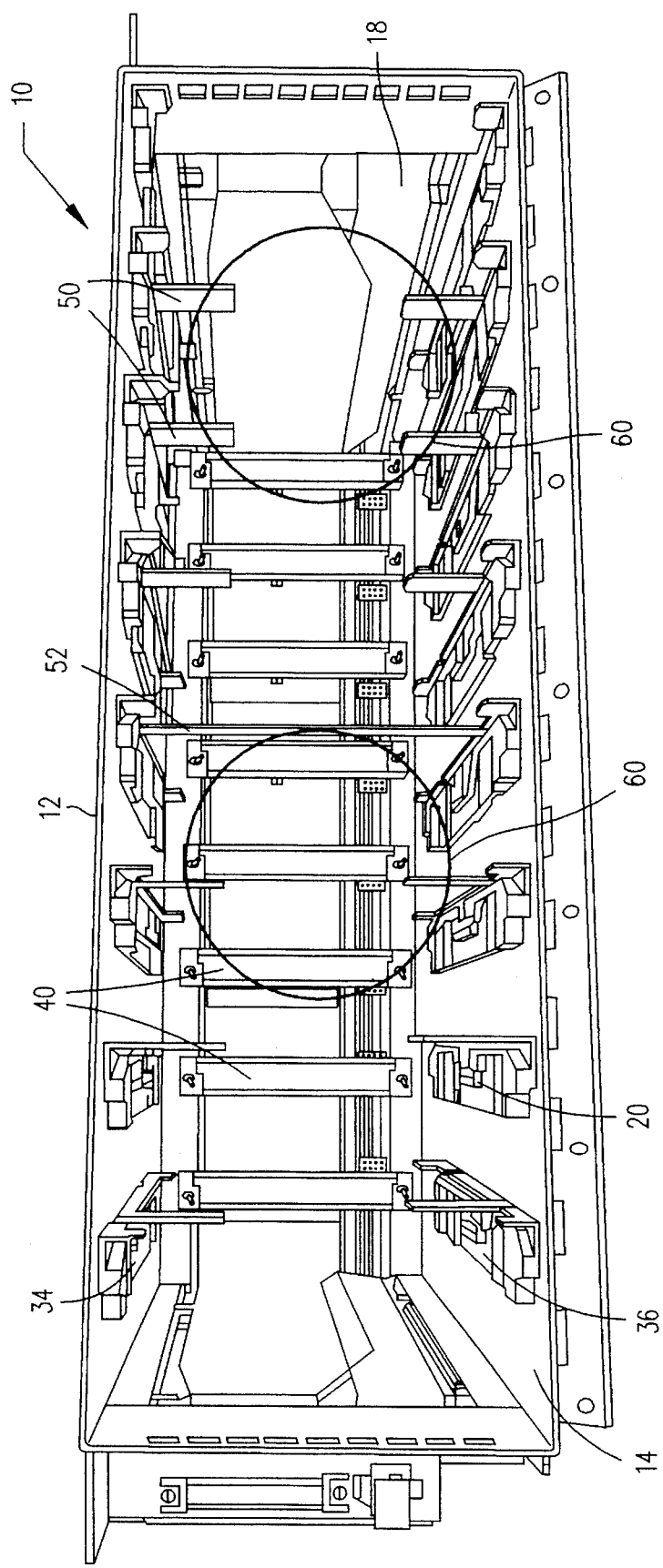
FIG. 2 is a front perspective view of the housing of FIG. 1.

With reference to FIGS. 1 and 2, there is shown a data storage subsystem housing 10 which is designed to receive and accommodate a plurality of electrical devices 30 (e.g., data storage devices, hard disk drives), one of which is shown separately from the housing in FIG. 1. The basic shell of the housing is essentially tubular in form with upper and lower walls 12,14 joined at their respective ends by side walls 16 and 18. The internal surfaces of the housing walls define a single cavity at the front of the housing into which cavity the storage devices are removably mountable. Fixed to the internal surface of each of the lower and upper walls are eight guide or loading rails 20. A carrier structure 32 mounted at the side of each storage device locates top and bottom in a pair of guide rails (e.g., 34 and 36) attached to upper and lower surfaces of the housing.

Fixed at the rear of the front cavity are eight power connectors 40, one per device, each of which mates with a corresponding connector (not shown) at the rear of each device when the device is fully loaded into the housing. Located behind the connectors is a rear compartment for housing a power supply (not shown) which provides power to each of the devices via power connector 40. Optionally, the rear compartment may also house device controller units to control operation of the storage devices, in which case power connector 40 may advantageously be employed to convey control signals to a device.

A typical data storage subsystem housing of the type shown in FIGS. 1 and 2 will be designed to house storage devices having an industry standard form factor; e.g., 3.5 or 5.25 inches. It will therefore be appreciated that the open nature of the front compartment is such that in the absence of any safety feature and if several storage devices are not in place in the housing it would be possible for an operator to inadvertently touch exposed power terminals at the rear of the compartment. It is therefore necessary to ensure that no exposed sources of energy are accessible by an operator. In order to satisfy this objective, the housing includes a plurality of safety fins 50 located near the front of the housing, each of the fins being vertically mounted onto a guide rail. The fins extend into the spaces between data storage devices and act to impede access of the operator's hand while at the same time allowing access to permit loading or unloading of the devices into or from the housing.

Figure 3:
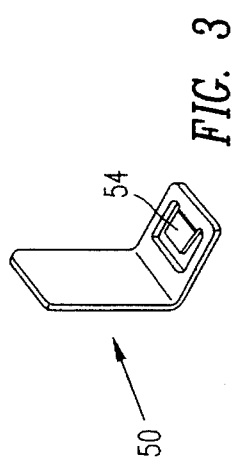
FIG. 3 is a perspective view of one of the safety fins shown in FIG. 1.

FIG. 3 shows an isometric view of one of the safety fins prior to attachment to one of the guide rails. The fin is 'L' shaped in profile and includes a tang 54 in the horizontal portion which is designed to cooperate with features (not shown) in the guide rail to clip the fin in place. The narrow profile of each fin ensures that the fin occupies a minimum amount of space within the housing.

FIG. 2 shows by way of two 75 millimeter circles 60 superimposed on the drawing, how by placing vertical fins at strategic intervals across the housing, devices can be unloaded without hands being able to reach into the back of the housing. The 75 millimeter circle is representative of the International Standard Test Finger Handle, which defines the hole size the average small human hand cannot access.

It will be appreciated that the size and number of fins needed to achieve the necessary protection will be dependent on the dimensions of the housing opening and also on the depth of the power connectors in the housing. The position of the fin along the rail is a further consideration in determining the size and number of fins necessary to provide sufficient protection. Given the overall requirement that the operator must be unable to access exposed portions of the connector, the skilled man will readily be able to determine the fin configuration necessary to achieve protection for any specific housing.

As an alternative to the fin configuration shown in FIG. 1, it would in principle be possible to provide the required protection by inclusion of only upwardly or downwardly extending fins, each such fin extending further into the cavity than a fin of FIG. 1. Furthermore, it may only be necessary in some housings to locate fins in alternate guide rails.

It will be noted in FIG. 1 that in place of two central fins there is included a vertical strut 52 which extends the whole depth of the housing. The use of such a strut provides extra structural robustness while at the same time contributing to access protection.

We claim:

1. A housing having a cavity for accommodating a plurality of electrical devices each device having a connector, comprising:

a power source;

a plurality of internally mounted power connectors each having an exposed portion for mating with a corresponding connector on said plurality of electrical devices for connecting each of said electrical devices to said power source; and finger access prevention means mounted fixedly within said housing cavity for preventing an operator from accessing the exposed portion of said power connectors.

2. A housing apparatus as recited in claim 1, in which said finger access prevention means comprises at least one access prevention element.

3. A housing apparatus as recited in claim 2, in which said access prevention element is positioned between adjacent ones of the plurality of electrical devices so as not to impede removal of said electrical devices.

4. A housing apparatus as recited in claim 2, in which said access prevention element is a fin positioned between adjacent ones of said plurality of electrical devices.

5. A housing having a cavity and an opening at one of its ends, said housing being used for accommodating a plurality of electrical devices each having a connector and each removably mountable in the cavity within said housing via the opening, said housing comprising:

a power source;

a plurality of internally mounted power connectors each having an exposed portion for connecting each of said electrical devices to said power source, said power connectors being positioned at a side of the housing cavity opposite said opening to mate with a corresponding connector on each of said electrical devices; and finger access prevention means mounted fixedly within said housing cavity for preventing an operator from accessing the exposed portion of said power connectors.

6. A housing apparatus as recited in claim 5, in which said finger access prevention means comprises at least one access prevention element.

7. A housing apparatus as recited in claim 6, in which said access prevention element is positioned between adjacent ones of the plurality of electrical devices so as not to impede removal of said electrical devices.

8. A housing apparatus as claimed in claim 6, in which said access prevention element is a fin positioned between adjacent ones of the electrical devices.

9. A housing apparatus as recited in claim 7, further comprising a plurality of guide rails attached inside the housing cavity and extending from a position at or near the opening to said power connectors, each of the plurality of electrical devices being mountable via one side thereof onto at least one of said guide rails, wherein said access prevention element is fixed to at least one of said guide rails and extends perpendicularly therefrom.

10. A housing apparatus as recited in claim 9, in which said access prevention element is a fin.

* * * * *